United States Patent [19]

Itaya et al.

[11] Patent Number: 4,845,642

[45] Date of Patent: Jul. 4, 1989

[54] DISPLAY DEVICE FOR COMPLEX TRANSMISSION REFLECTION CHARACTERISTICS

[75] Inventors: Hiroshi Itaya, Isehara; Goro Saito, Aikawamachi, both of Japan

[73] Assignee: Anritsu Corporation, Tokyo, Japan

[21] Appl. No.: 2,753

[22] PCT Filed: Apr. 8, 1986

[86] PCT No.: PCT/JP86/00170

§ 371 Date: Dec. 1, 1986

§ 102(e) Date: Dec. 1, 1986

[87] PCT Pub. No.: WO86/06175

PCT Pub. Date: Oct. 23, 1986

[30] Foreign Application Priority Data

Apr. 8, 1985 [JP] Japan .................................. 60-72574

[51] Int. Cl.$^4$ ............................................. G06F 15/42
[52] U.S. Cl. ................... 364/518; 324/121 R; 324/57 R
[58] Field of Search ................ 364/518, 521; 340/727, 340/784, 724, 747, 709, 734; 379/6, 14, 28; 324/58 R, 58 A, 58 B, 58.5 B, 121, 57 R

[56] References Cited

U.S. PATENT DOCUMENTS

| | | | |
|---|---|---|---|
| 4,202,037 | 5/1980 | Glaser et al. | 364/518 |
| 4,415,928 | 11/1983 | Strolle et al. | 358/140 |
| 4,450,442 | 5/1984 | Tanaka | 340/814 |
| 4,598,368 | 7/1986 | Umemura | 364/414 |
| 4,621,226 | 11/1986 | Powell | 324/58 B |
| 4,680,538 | 7/1987 | Dalman et al. | 324/58 R |
| 4,694,407 | 9/1987 | Ogden | 364/518 |
| 4,695,966 | 9/1987 | Takakura et al. | 364/521 |
| 4,704,573 | 11/1987 | Turner, Jr. | 324/58 R |
| 4,761,640 | 8/1988 | Slavin | 340/709 |

OTHER PUBLICATIONS

Hewlett Packard "Electronic Instruments and Systems", 1983, pp. 426-443.
IEEE Transactions on Microwave Theory and Technique, vol. MTT-32, No. 12, Dec. 1984, pp. 1678-1682.
IEEE Transactions on Microwave Theory and Techniques, vol. MTT-30, No. 2, Feb. 1982, pp. 186-192.
IEEE Proceedings, Section A-1, vol. 131, No. 3, part H, Jun. 1984, pp. 186-190.

Primary Examiner—Gary V. Harkcom
Assistant Examiner—Phu K. Nguyen
Attorney, Agent, or Firm—Frishauf, Holtz, Goodman & Woodward

[57] ABSTRACT

A display device for complex transmission reflection characteristics processes the amplitude and phase of input complex number data, and displays the processed amplitude and phase. A number of types of coordinate chart image data are stored in a memory and displayed, and chart image data selection circuitry selectively reads one or more types of the coordinate chart image data from the coordinate chart data memory, in response to an input display command signal. A gain controller/phase shifter gain-controls the amplitude and phase of the input complex number data, to correspond to the selected image coordinate data, and signal-processing circuitry superposes the one or more types of selected chart image data and complex number data processed by the gain controller/phase shifter. The input complex number data is then displayed in a desired one or more types of coordinate systems.

3 Claims, 6 Drawing Sheets

DISPLAY DEVICE FOR COMPLEX TRANSMISSION REFLECTION CHARACTERISTICS

BACKGROUND OF THE INVENTION

1. Field of the Invention

The present invention relates to a display device for complex transmission reflection characteristics and, more particularly, to a display device for complex transmission reflection characteristics, which displays a coordinate system, such as an impedance coordinate system or an admittance coordinate system used for measuring impedance or admittance of an RF circuit, individually or in a superposed manner.

2. Description of the Known Art

Figure 2A:
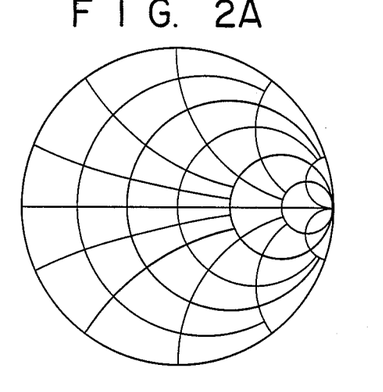
FIGS. 2(A), 2(B), and 2(C) are impedance charts.
Figure 3A:
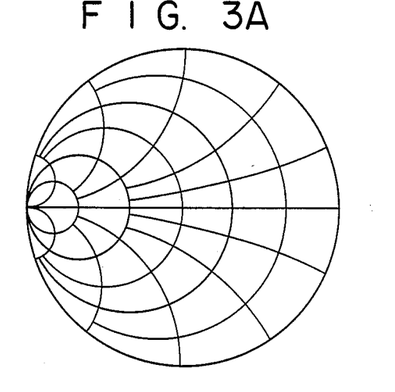
FIGS. 3(A), 3(B), and 3(C) are admittance charts.

Smith charts, as shown in FIGS. 2(A) and 3(A), are conventionally used for analysis of RF circuits. A Smith chart was first used by Smith at the Bell Institute (U.S.A.) in the 1930s and is divided into an impedance chart shown in FIG. 2(A) and an admittance chart shown in FIG. 3(A).

An impedance chart is obtained by plotting impedance Z, expressed as complex number $Z = R + jX$ which consists of resistance R and reactance X, using a frequency as a parameter. An admittance chart is obtained by plotting admittance Y, expressed as complex number $Y = G + iB$ which consists of conductance G and susceptance B, using a frequency as a parameter.

Each of the impedance and admittance planes shown in FIGS. 2(A) and 3(A) can be superposed with a reflection coefficient plane. Note that a reflection coefficient plane represents a vector of reflection coefficient $\Gamma$ given by $\Gamma = |\Gamma| e^{j\theta}$ where $|\Gamma|$ is the magnitude of a vector when the radius of the outermost circle of the Smith chart is 1, and $\theta$ is the rotational angle of the vector.

Figure 4:
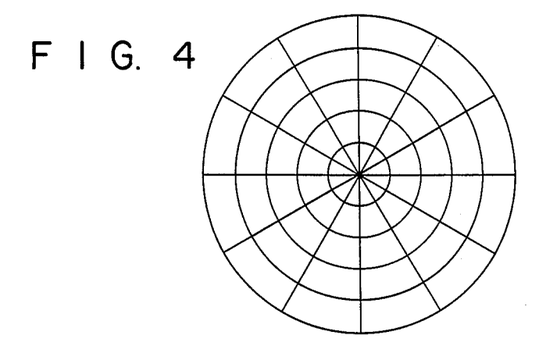
FIG. 4 is a polar chart.

In conventional display devices which display polar coordinates or reflection characteristics in order to provide transmission characteristics represented in complex numbers, display methods of impedance or admittance coordinates are roughly divided into the following two systems:

According to the first system, a transparent plate with a polar chart, shown in FIG. 4, printed thereon is provided on the screen of a CRT. For monitoring, a transparent sheet made of cellophane or the like with the impedance chart shown in FIGS. 2(A), 2(B), and 2(C), or a polar chart shown in FIG. 4, printed thereon, is adhered to the transparent plate. In this manner, when obtained data is to be recorded, a semi-transparent recording sheet with the impedance chart shown in FIGS. 2(A), 2(B), and 2(C), or the polar chart shown in FIG. 4, printed thereon, is adhered to the screen of the CRT, and the displayed data is manually transferred to the recording sheet, using a soft pen or the like.

Figure 2B:
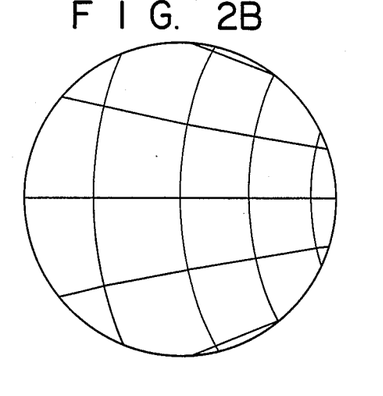

According to the second system, the polar chart shown in FIG. 4, or only the two impedance charts, shown in FIGS. 2(A) and 2(B), are separately, electronically displayed on the screen of the CRT.

With the first system, however, the transparent sheet may be misaligned with the transparent plate, or defective gain control may occur between the printed chart circle and the CRT, resulting in incorrect trace data. In addition, the data can only be recorded manually by the person monitoring the screen.

Figure 2C:
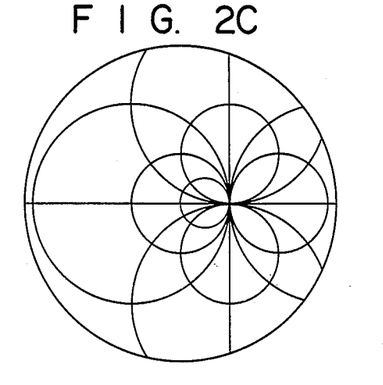

With the second system, since the compression impedance chart shown in FIG. 2(C) is not provided, the trace within a negative resistance region of $\Gamma > 1$ cannot be observed. In addition, unless the data is subjected to transformation of coordinates through 180°, the trace data of the admittance cannot be obtained. Since a constant conductance circle and a constant susceptance circle are not provided in the coordinate representation, a shift of the parameter in the admittance plane cannot be easily simulated.

SUMMARY OF THE INVENTION

It is an object of the present invention to eliminate the above drawbacks. It is also an object of the present invention to provide a display device for complex transmission reflection characteristics, which displays a necessary coordinate system, such as a polar chart, an impedance chart, or an admittance chart independently, in a superposed manner, or in a rotated manner, through an arbitrary angle, electronically on the display screen without changing the position of the trace data on the display screen, so that the data can be easily traced.

The present invention provides a display device for complex transmission reflection characteristics, comprising coordinate data storage means for storing, in advance, a plurality of desired types of image coordinate data to be displayed, display data designation means for selectively designating one or a combination of the plurality of types of image coordinate data, image coordinate data read means for reading one or a combination of the plurality of image coordinate data from the image coordinate data storage means, in response to designation by the display data designation means, polar coordinate data-transforming means for transforming complex number data to be displayed into polar coordinate data, data processing means for superposing one or a plurality of image coordinate data read by the image coordinate data read means, with the polar coordinate data transformed by the polar coordinate transforming means, and image display means for displaying images of one or a plurality of image coordinate data and the polar coordinate data superposed by the data processing means.

DESCRIPTION OF THE PREFERRED EMBODIMENTS

An embodiment of the present invention will now be described in detail with reference to the accompanying drawings.

Figure 1A:
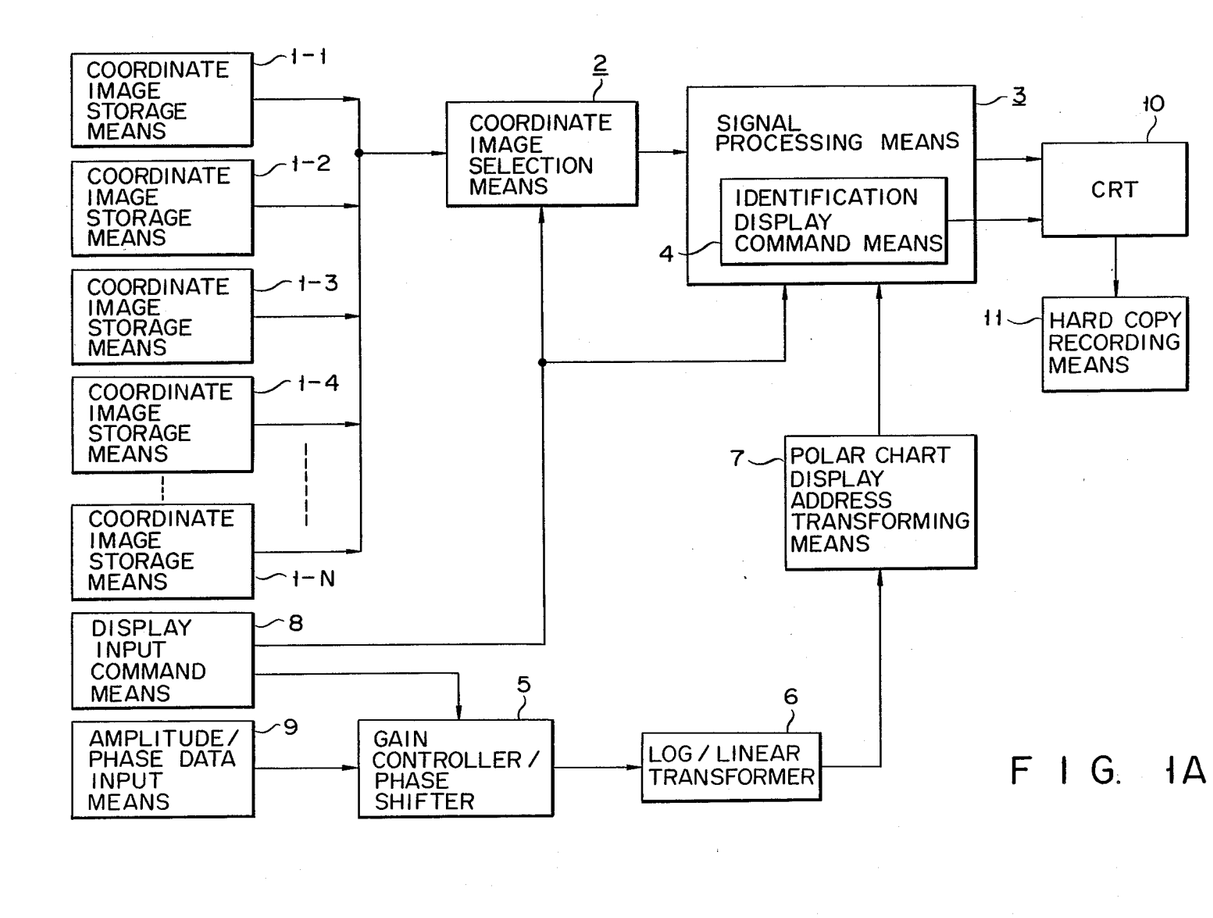
FIGS. 1(A) and 1(B) are respectively, a schematic diagram showing a display device for complex transmission reflection characteristics according to an embodiment of the present invention, and a block diagram showing a practical example of the same.
Figure 1B:
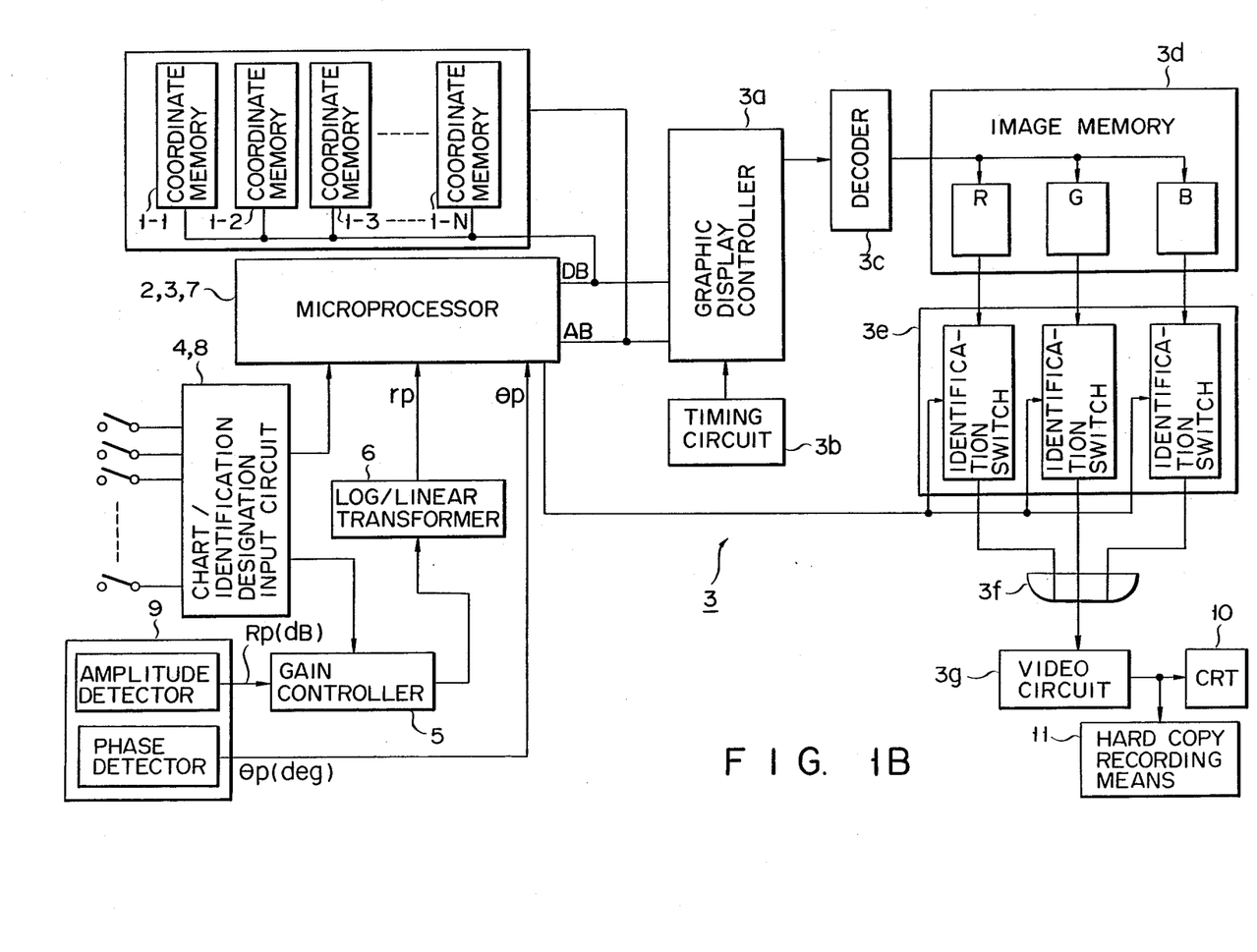

Referring to FIGS. 1(A) and 1(B), reference numerals 1-1, 1-2, 1-3, ... to 1-N denote a plurality of image coordinate data storage means (coordinate memories); 2, an image coordinate data selection means (a microprocessor); 3, a signal-processing means (including a microprocessor, graphic display controller 3a, timing circuit 3b, decoder 3c, and so on); 4, a chart identification display command means (a chart identification designation/designation input circuit); 5, a gain controller/phase shifter; 6, a log/linear transformer; 7, a polar chart display address-transforming means (microprocessor); 8, a display input designation means (a chart identification designation/designation input circuit); 9, an amplitude/phase data input means (an amplitude detector, a phase detector); 10, a CRT as an image display means; and 11, a hard copy recording means.

Image coordinate data storage means (coordinate memories) 1-1 to 1-N are memories such as ROMs, which store a plurality of desired image coordinate data to be displayed. For example, image coordinate data storage means (coordinate memory) 1-1 stores the image coordinate data of a standard impedance chart shown in FIG. 2(A). Image coordinate data storage means (coordinate memory) 1-2 stores the image coordinate data of a standard admittance chart, shown in FIG. 3(A). Similarly, image coordinate data storage means (coordinate memories) 1-3, 1-4, ... to 1-N individually store image coordinate data, such as the enlarged impedance chart and the compressed impedance chart shown in FIGS. 2(B) and 2(C), respectively, the enlarged admittance chart and the compressed admittance chart shown in FIGS. 3(A) and 3(B), respectively, and the polar chart shown in FIG. 4. Other image coordinate data, such as an inverted Smith chart obtained by transforming a negative impedance half-plane, is also stored as required.

Image coordinate selection means (microprocessor) 2 designates one or a plurality of image coordinate data storage means (coordinate memories) 1-1, 1-2, 1-3, ... to 1-N, in accordance with a display command (chart identification designation/designation input) signal from display input designation means (chart identification designation/designation input circuit) 8, and reads image coordinate data stored therein.

Signal-processing means (microprocessor) 3 performs predetermined signal processing in accordance with one or a plurality of image coordinate data selected and read out by image coordinate data selection means (microprocessor) 2, and with data which is converted into an address on the polar chart representation on which a dot is to be formed, based on the polar coordinate data of display complex number data, i.e., data representing both the magnitude and angle of a vector. The polar coordinate data is input via amplitude/phase data input means (the amplitude detector, the phase detector) 9 to be described later, gain controller/phase shifter 5, log/linear transformer 6, and polar chart display address-transforming means (microprocessor) 7. First, when one-type image coordinate data is read out, signal-processing means (microprocessor) 3 superposes data converted into a corresponding address, on a position of the chart corresponding to the image coordinate data. When a plurality of types of image coordinate data are read out, signal-processing means (microprocessor) 3 superposes charts corresponding to these image coordinate data with each other, and superposes the data converted into the address on the positions of the charts.

Signal-processing means (microprocessor) 3 reads out the plurality of types of image coordinate data via image coordinate data selection means (microprocessor) 2, and outputs display data, such as color, brightness, broken line, and so on, for each chart in accordance with a designation which facilitates easy identification of the chart designated, to correspond to the image coordinate data designated by chart identification display command means (chart identification designation/designation input circuit) 4.

Figure 5A:
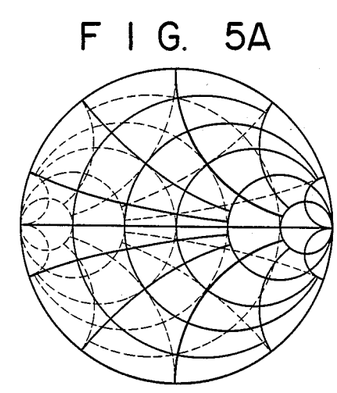
FIGS. 5(A), 5(B), and 5(C) are immittance charts.

Assume that display input designation means (chart identification designation/designation input circuit) 8 outputs display command signals representing the standard impedance chart and the standard admittance chart shown in FIGS. 2(A) and 3(A), respectively. In this case, image coordinate data selection means (microprocessor) 2 accesses image coordinate data storage means (coordinate memories) 1-1 and 1-2, to read image coordinate data of the standard impedance chart from image coordinate data storage means (coordinate memory) 1-1, and image coordinate data of the standard admittance chart from image coordinate data storage means (coordinate memory) 1-2. These image coordinate data are superposed by signal-processing means (microprocessor) 3. At the same time, a chart identification display command representing, for example, a standard impedance chart or a standard admittance chart, from chart identification display command means (chart identification designation/designation input circuit) 4 is added to chart identification display data represented by a solid line and a broken line, respectively, and is supplied to CRT 10 as image coordinate data. As a result, a standard immittance chart, as shown in FIG. 5(A), is displayed on the screen of CRT 10. Note that an immittance chart is a chart obtained by superposing impedance and admittance charts of the same scale.

Meanwhile, amplitude/phase data input means (the amplitude detector, the phase detector) 9 supplies data of polar coordinates represented by an amplitude and a phase from, for example, a network analyzer. Amplitude component Rp (dB) is gain-controlled by gain controller/phase shifter 5. Gain controller/phase shifter 5 performs gain control in accordance with a chart designated by display input designation means (chart identification designation/designation input circuit) 8. In this case, display input designation means (chart identification designation/designation input circuit) 8 designates the standard impedance and admittance charts, shown in FIGS. 2(A) and 3(A), respectively. Therefore, the gain is 1 and the input is output with the same amplitude, without control by gain controller/phase shifter 5. The amplitude is generally a logarithmic value (Log value) and is thus converted into a linear value (linear value) by log/linear transforming means (log/linear transformer) 6, located at the next stage. Log/linear transforming of the amplitude can be performed at the stage preceding gain controller/phase shifter 5. In summary, log/linear conversion can be performed in a manner appropriate for signal processing. Assume that display input designation means (chart identification designation/designation input circuit) 8 designates the enlarged impedance chart shown in FIG. 2(B). Then, an input amplitude is controlled by gain controller/phase shifter 5 with a gain according to the enlarged impedance chart, and thereafter the log amplitude is converted into linear amplitude Yp.

The phase is not processed at all but is output directly as phase $\theta p$ from gain controller/phase shifter 5 or phase detector 9. Therefore, polar coordinate data representing the amplitude and phase corresponding to the chart designated by display input designation means (chart identification designation/designation input circuit) 8 is input to polar chart display address-transforming means (microprocessor) 7. Polar chart display address-transforming means (microprocessor) 7 calculates horizontal and vertical components Y pcos$\theta$ p and Ypsin$\theta$ p of the polar coordinates from input amplitude Yp and phase $\theta$p, in order to obtain the address of a position on a polar chart on which a dot of the polar coordinate data is to be formed, based on the known address of the origin of the polar chart, Ypcos$\theta$ p, and Ypsin$\theta$ p. In this manner, the polar coordinate data representing the amplitude and phase corresponding to the chart designated by display input designation means (chart identification designation/designation input circuit) 8 is input to polar chart display address-transforming means (microprocessor) 7, so as to be converted into data representing the address of a position on which the dot is to be formed on the polar chart.

The data converted into the address is supplied to signal-processing means (microprocessor) 3, so as to be superposed on the image coordinate data of the standard impedance chart read from image coordinate data storage means (coordinate memory) 1-1 and the image coordinate data of the standard admittance chart read from image coordinate data storage means (coordinate memory) 1-2. As a result, the polar coordinate data representing the amplitude and phase output from data amplitude/phase input means (the amplitude detector, the phase detector) 9 is traced at a corresponding position on the standard immittance chart, shown in FIG. 5(A), which is displayed on the screen of CRT 10.

The above processing is performed every time data is input from amplitude/phase data input means (the amplitude detector, the phase detector) 9. Therefore, the input data is traced on the display screen of CRT 10, in which the standard immittance chart has been displayed.

Figure 6:
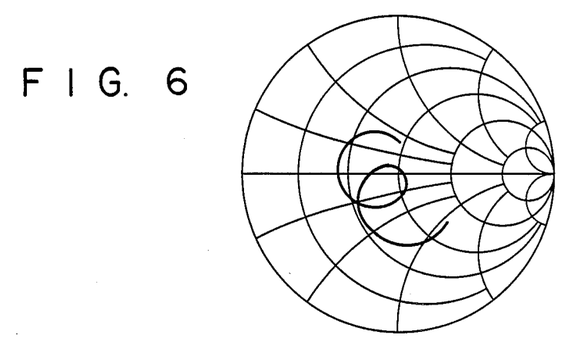
FIG. 6 is a view wherein image coordinate and complex number data are superposed.

When the display command signal representing the standard admittance chart, shown in FIG. 3(A), is removed from display input designation means (chart identification designation/designation input circuit) 8, image coordinate data selection means (microprocessor) 2 stops accessing image coordinate data storage means 1-2. Therefore, only one type of image coordinate data of the standard impedance chart is supplied to signal-processing means (microprocessor) 3 from image coordinate data storage means (coordinate memory) 1-1. As a result of this, only the standard admittance chart is deleted from the screen of CRT 10. This state is shown in FIG. 6. Inversely, when the display command signal representing the standard impedance chart, shown in FIG. 2(A), is removed from display input designation means (chart identification designation/designation input circuit) 8, only the standard impedance chart is deleted from the screen of CRT 10.

When display input designation means (chart identification designation/designation input circuit) 8 performs selective designation, the standard impedance and admittance charts can be alternately displayed on the screen of CRT 10, as is apparent from the above description.

Next, assume that a display command signal representing the enlarged impedance chart shown in FIG. 2(B) is output from display input designation means (chart identification designation/designation input circuit) 8. Also assume that the image coordinate data of the enlarged impedance shown in FIG. 2(B) is stored in image coordinate storage means (coordinate memory) 1-3. Thus, image coordinate data selection means (microprocessor) 2 accesses image coordinate data storage means (coordinate memory) 1-3, to read out image coordinate data of the enlarged impedance chart therefrom, and supplies the data to signal-processing means (microprocessor) 3.

Meanwhile, display input designation means (chart identification designation/designation input circuit) 8 also supplies the display command signal representing the enlarged impedance chart to gain controller/phase shifter 5. The gain of controller 5 is switched to one according with the enlarged impedance chart. As a result, the amplitude of the input data supplied from amplitude/phase data input means (the amplitude detector, the phase detector) 9 is amplified by gain controller/phase shifter 5 by the gain corresponding to the enlarged impedance chart, and is converted into a linear value by log/linear transforming means (log/linear transformer) 6. Note that the phase is not changed. The polar coordinate data obtained in this manner is the address data which is converted into an address of a position on the polar chart at which a dot is to be formed. The address data is supplied to signal-processing means (microprocessor) 3, and is superposed with the image coordinate data of the enlarged impedance chart described earlier. As a result, the enlarged impedance chart shown in FIG. 2(B) is displayed on the screen of CRT 10 and, at the same time, the input data is traced at a corresponding position on the enlarged impedance chart.

Figure 3B:
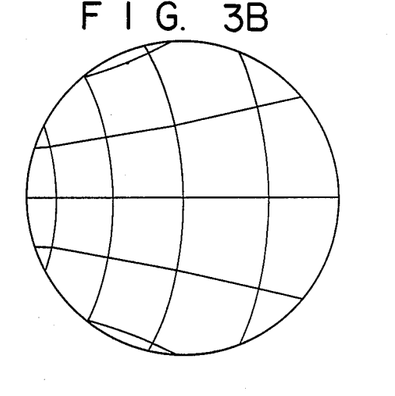
Figure 5B:
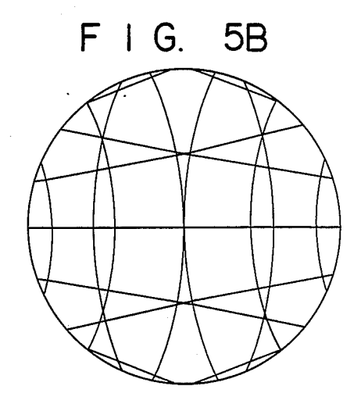

As is described above, the enlarged admittance chart shown in FIG. 3(B) can be displayed on the screen of CRT 10 by the display command signal from display input designation means (chart identification designation/designation input circuit) 8. The enlarged impedance and admittance charts can be displayed alternately. The enlarged immittance chart, shown in FIG. 5(B), which is obtained by superposing the enlarged impedance and admittance charts, can also be displayed.

Figure 3C:
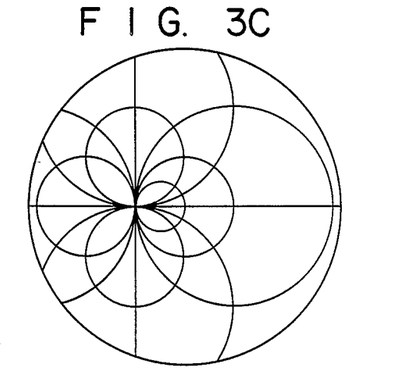
Figure 5C:
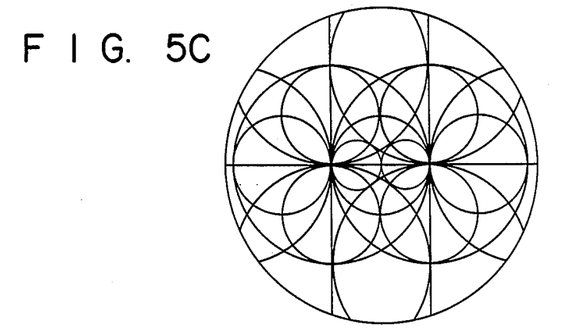

In the same manner, a compressed impedance chart, a compressed admittance chart, and a compressed immittance chart thereof, shown in FIGS. 2(C), 3(C), and 5(C), respectively, can be freely displayed by means of a display command signal from display input designation means (chart identification designation/designation input circuit) 8. In this case, the image coordinate data representing the compressed impedance and compressed admittance charts, shown in FIGS. 2(C) and 3(C), respectively, are stored in one of image coordinate data storage means (coordinate memories) 1-1 to 1-N.

Figure 7:
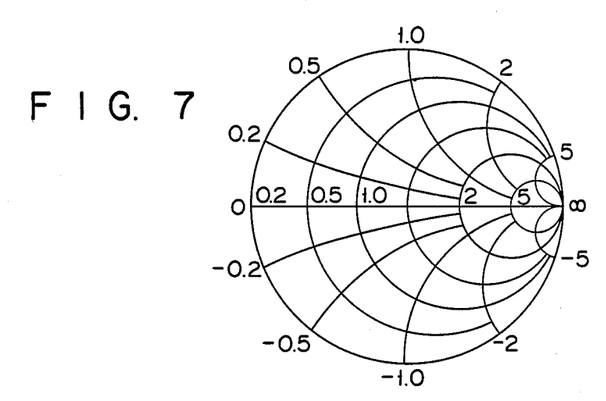
FIG. 7 shows an example of a normalized standard impedance chart with a scale displayed in solid lines.

FIG. 7 shows an example of a normalized standard impedance chart with a scale. The scale is used when a normalized impedance is directly read from the chart. In a display system wherein a value of complex number data can be digitally displayed, the scale value is apparent from the chart name, such as impedance or admittance, and the chart name indicating the direction of amplitude, such as standard, enlarged, and compressed, and thus need not be displayed. The scale character data can be stored in image coordinate data storage means (coordinate memories) 1-1, 1-2, 1-3, . . . to 1-N, together with corresponding image coordinate data. When a large number of image coordinate data are superposed and displayed, the scale is often omitted, since it complicates the data representation.

Figure 8:
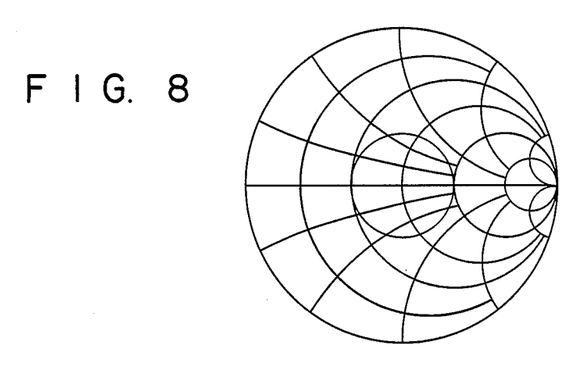
FIG. 8 shows an example of a circle of an equistanding wave ratio (SWR)

Note that the circle of equi-standing wave ratio (SWR) has a central point identical to that of the outermost circles of the impedance, admittance, and polar charts, FIG. 8 shows an example wherein a normalized standard impedance chart is superposed with the equi-standing wave ratio.

When the image coordinate data, such as the standard polar coordinate chart shown in FIG. 4, is stored in any one of image coordinate data storage means (coordinate memories) 1-1 to 1-N, coordinate images (with or without scales) can be displayed on the CRT screen independently or in a superposed state with another coordinate image or with complex number data. In this case, the coordinate images are:

① (i) a normalized impedance chart, represented by a solid line (with a scale)
   (ii) a normalized admittance chart, represented by a broken line
   (iii) a polar coordinate chart, represented by a long and short dashed line
② (i) an immittance chart with impedance in red and admittance in green
   (ii) a polar coordinate chart in blue
③ (i) a normalized impedance chart in blue
   (ii) a circle of equi-standing wave ratio in red
④ an enlarged Smith chart
⑤ a compressed Smith chart If, for example, a Smith chart is the chart in question, data representing its radius, center, and curvature are stored in image coordinate data storage means (coordinate memories) 1-1 to 1-N as image coordinate data of the respective charts. In this case, when the respective charts are to be displayed based on these data, basic data can be stored and a corresponding chart is displayed on the basis thereof.

In FIG. 1(B), the microprocessor of signal-processing means 3 has a coordinate image-selecting function for fetching each designating signal from chart identification designation/designation input circuits (4, 8) and accessing coordinate memories 1-1, 1-2, 1-3, ..., to 1-N, and a function for converting amplitude Yp supplied from log/linear transformer 6 into a polar chart display address, as described above. Also, the microprocessor of signal-processing means 3 controls the entire device. Signal-processing means 3 comprises, in addition to a microprocessor, graphic display controller (e.g., a known 63484 ACRTC model) 3a, image memory 3d, identification switching circuit 3e, video circuit 3g, and timing circuit 3b. Various types of processing data are supplied from the microprocessor (e.g., a known 68000 MPU model) of signal-processing means 3 and are set in graphic display controller 3a via data and address buses DB and AB. The data set in controller 3a is written in memory 3d via decoder 3c (e.g., a known 74138 model), in accordance with colors R, G, and B. Switching circuit 3e switches the data read out from memory 3d in accordance with the three color components, based on the identification signal from the microprocessor of signal processor 3. OR circuit 3f converts the data output from identification switching circuit 3e, into a video signal, and video circuit 3g supplies the video signal to CRT 10. Timing circuit 3b supplies, to controller 3a, a predetermined timing pulse which is required for write-in and readout of image memory 3d.

Figure 9:
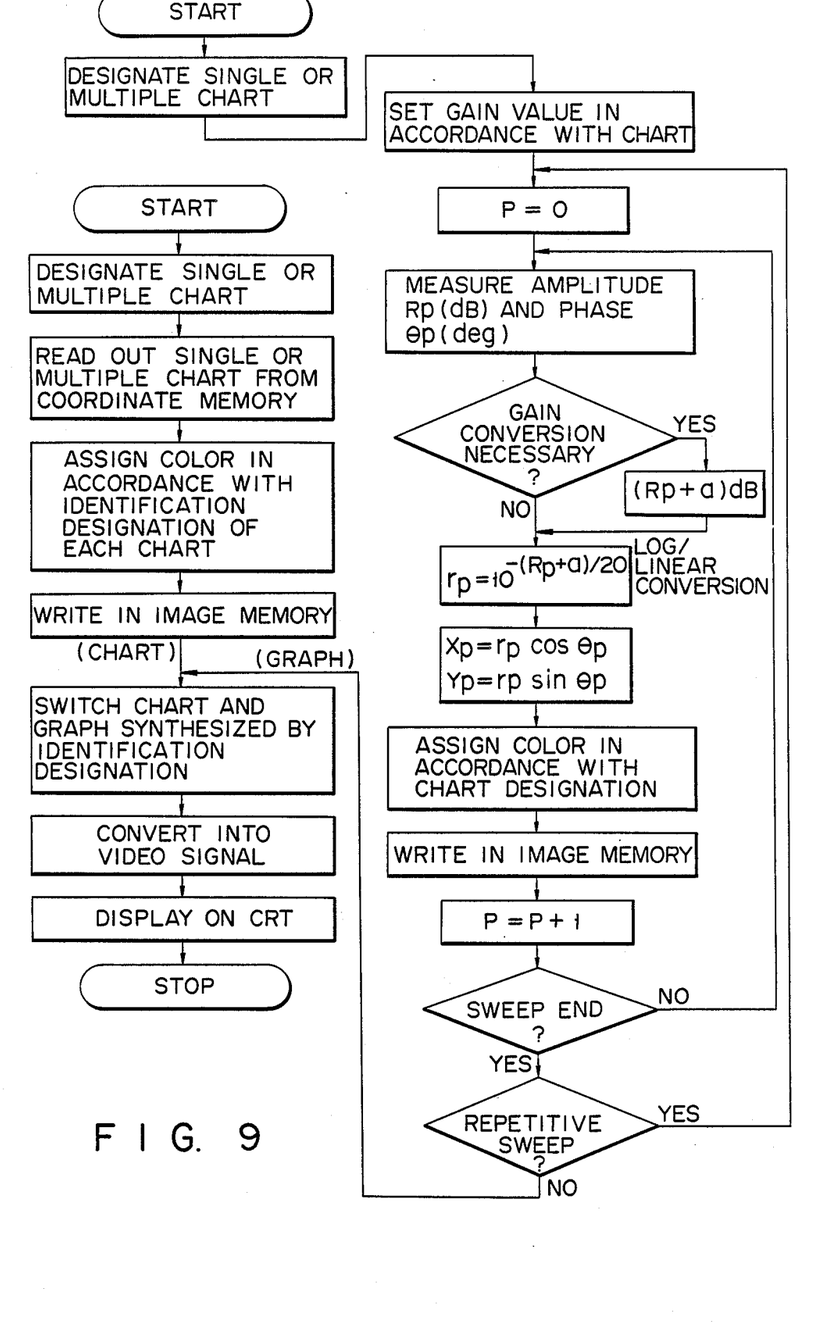
FIG. 9 is a flow chart showing the operation of the device shown in FIG. 1(B).

FIG. 9 is a flow chart showing mainly the operation of the device shown in FIGS. 1(A) and 1(B). A graph processing system is shown on the right half, a chart processing system is shown on the upper left portion, and a synthesis processing system of the graph and chart is shown on the lower left portion of FIG. 9, respectively.

As is described above, according to the present invention, since the image coordinate data storage means stores image coordinate data, transformation of coordinates can be performed easily and instantaneously. Since data can be displayed on a coordinate plane displaying equi-resistance, equi-reactance, equiconductance, or equi-susceptance circles, an RF circuit can be simulated easily. In addition, the position of the data on the coordinate plane can be visually checked and can be provided as a hard copy. A plurality of arbitrary coordinate systems can be displayed independently, alternatively, or in a superposed state.

We claim:

1. A display device for complex transmission reflection characteristics, comprising:

chart image coordinate data storage means for storing, in advance, a plurality of desired coordinate chart image data including data to display one of a number of charts including a standard impedance chart, a standard admittance chart, at least one of an enlarged and a compressed impedance chart, at least one of an enlarged and a compressed admittance chart, and a polar chart;

amplitude/phase data input means for inputting amplitude data and phase data in the form of complex numbers;

chart designation means for providing a first designation command signal to display a first desired chart from among said number of charts, means for providing a second designation command signal to display a second desired chart from among a standard immittance chart, and at least one of an enlarged immittance chart and a compressed immittance chart, and means for outputting standard, enlarged or compressed gain data in accordance with either of said first and said second designation command signals;

gain control means to said amplitude/phase data input means and said chart designation means, for controlling gain of said amplitude data in accordance with said gain data;

data processing means, coupled to said chart image coordinate data storage means, said chart designation means, said gain control means, and said amplitude/phase data input means, including means for reading coordinate chart image data of the first chart designated by said first designation command signal, means responsive to said second command designation signal for obtaining coordinate chart image data corresponding to said second chart by reading a combination of the stored coordinate chart image data for said standard impedance chart and said standard admittance chart, or a combination of the stored coordinate chart image data for said enlarged or compressed impedance chart and said enlarged or compressed admittance chart, means for outputting display data for chart identification in accordance with either of said first and said second designation command signals, means for obtaining graph position data including means for transforming said input amplitude data and phase data in corresponding relationship with the desired chart designated by either of said first and said second designation command signals, and means for superposing the obtained graph position data on the readout coordinate chart image data; and image display means for displaying the output data from said data processing means.

2. A device according to claim 1, comprising log/linear transformer means, connected between said amplitude/phase data input means and said data processing means for converting a logarithmic value indicative of said amplitude data into a linear value.

3. A device according to claim 1, wherein said image coordinate data storage means is arranged to store in advance coordinate chart image data of a standard polar coordinate chart.

* * * * *